(12) United States Patent
Sato et al.

(10) Patent No.: US 8,231,990 B2
(45) Date of Patent: Jul. 31, 2012

(54) ALLOY FILM FOR A METAL SEPARATOR FOR A FUEL CELL, A MANUFACTURING METHOD THEREOF AND A TARGET MATERIAL FOR SPUTTERING, AS WELL AS A METAL SEPARATOR, AND A FUEL CELL

(75) Inventors: Toshiki Sato, Kobe (JP); Jun Suzuki, Kobe (JP); Yoshinori Ito, Kobe (JP); Hirotaka Ito, Kobe (JP); Shinichi Tanifuji, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 340 days.

(21) Appl. No.: 12/517,607

(22) PCT Filed: Dec. 12, 2007

(86) PCT No.: PCT/JP2007/073913
§ 371 (c)(1),
(2), (4) Date: Jun. 4, 2009

(87) PCT Pub. No.: WO2008/075591
PCT Pub. Date: Jun. 26, 2008

(65) Prior Publication Data
US 2010/0035118 A1     Feb. 11, 2010

(30) Foreign Application Priority Data

Dec. 21, 2006 (JP) ................................. 2006-344895
Sep. 21, 2007 (JP) ................................. 2007-245917

(51) Int. Cl.
*H01M 8/02* (2006.01)
*H01M 2/16* (2006.01)
*C23C 14/34* (2006.01)
*C22F 1/00* (2006.01)

(52) U.S. Cl. ................ 429/34; 204/192.15; 204/298.13; 148/518

(58) Field of Classification Search .................. 429/485, 429/487, 34; 204/192.15, 298.13; 148/518
See application file for complete search history.

(56) References Cited

U.S. PATENT DOCUMENTS
3,833,410 A * 9/1974 Ang et al. .................... 428/333
(Continued)

FOREIGN PATENT DOCUMENTS
EP 2 157 645 A1 2/2010
(Continued)

OTHER PUBLICATIONS

A. Bonakdarpour et al. "Acid stability and oxygen reduction activity of magnetron-sputtered Pt 1-x Ta x (0<x<1) films", 2006 available electronically Oct. 2006, Journal of the Electrochemical Society, 153 (12), pp. A2304-A2313.*

(Continued)

*Primary Examiner* — Jessee R. Roe
(74) *Attorney, Agent, or Firm* — Oblon, Spivak, McClelland, Maier & Neustadt, L.L.P.

(57) ABSTRACT

The present invention concerns an alloy film for a metal separator for a fuel cell characterized by containing at least one noble metal element selected from Au and Pt and at least one non-noble metal element selected from the group consisting of Ti, Zr, Nb, Hf, and Ta, at a content ratio of noble metal element/non-noble metal element of 35/65 to 95/5, and having a film thickness of 2 nm or more. The present invention also relates to a manufacturing method of an alloy film for the metal separator for the fuel cell and a target material for sputtering, as well as the metal separator and the fuel sell. The alloy film for the metal separator for the fuel cell according to the invention is excellent in the corrosion resistance, has low contact resistance, can maintain the low contact resistance for a long time even in a corrosive environment, and is excellent further in the productivity.

21 Claims, 4 Drawing Sheets

U.S. PATENT DOCUMENTS

| | | | |
|---|---|---|---|
| 4,834,855 A * | 5/1989 | Bloomquist et al. | 204/192.15 |
| 6,171,721 B1 * | 1/2001 | Narayanan et al. | 429/432 |
| 6,280,868 B1 * | 8/2001 | Badwal et al. | 429/487 |
| 2006/0003174 A1 * | 1/2006 | Yashiki et al. | 428/472 |

FOREIGN PATENT DOCUMENTS

| | | |
|---|---|---|
| JP | 45 36286 | 11/1970 |
| JP | 10 228914 | 8/1998 |
| JP | 2001 006713 | 1/2001 |
| JP | 2001 093538 | 4/2001 |
| JP | 2005 285345 | 10/2005 |
| JP | 2006 190643 | 7/2006 |
| WO | 2006 082734 | 8/2006 |

OTHER PUBLICATIONS

Supplementary European Search Report dated Dec. 23, 2011, in corresponding European Patent Application No. 07850464, filed on Dec. 12, 2007.

U.S. Appl. No. 12/615,377, filed Nov. 10, 2009, Ito, et al.

U.S. Appl. No. 12/709,935, Feb. 22, 2010, Sato et al.

* cited by examiner

FIG. 2
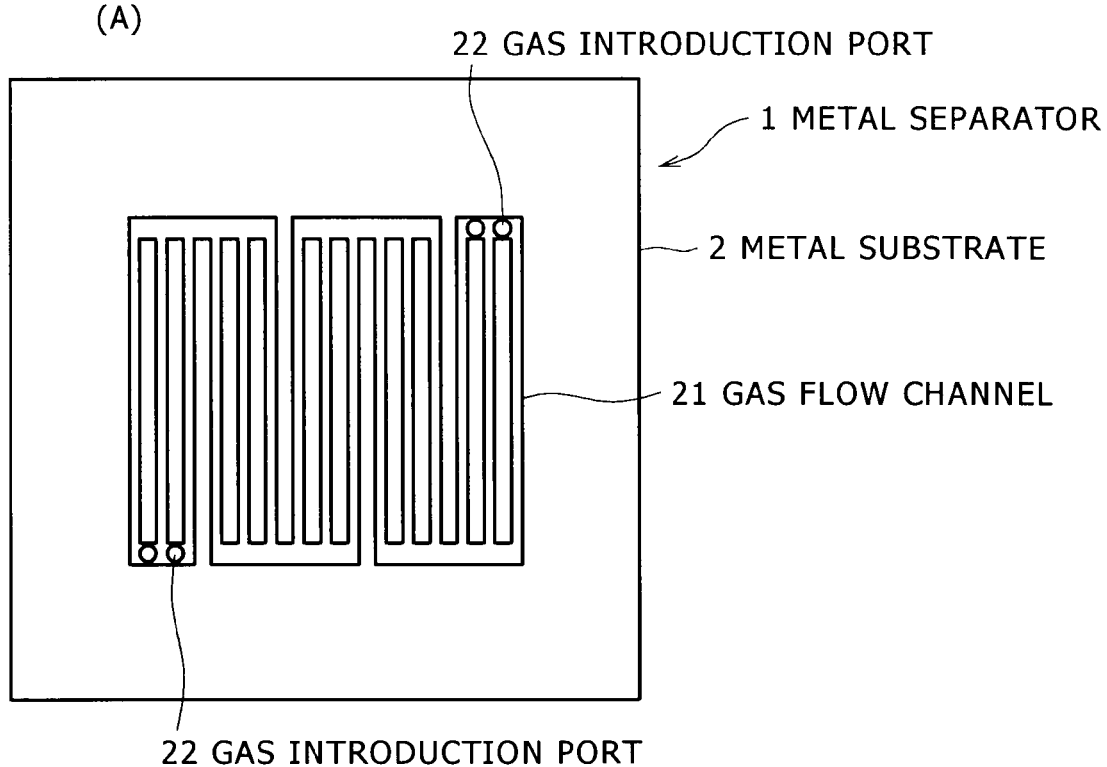
(A)
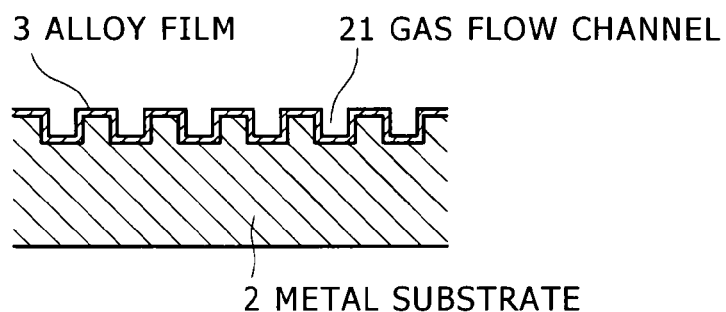
(B)

ALLOY FILM FOR A METAL SEPARATOR FOR A FUEL CELL, A MANUFACTURING METHOD THEREOF AND A TARGET MATERIAL FOR SPUTTERING, AS WELL AS A METAL SEPARATOR, AND A FUEL CELL

TECHNICAL FIELD

The present invention concerns an alloy film for a metal separator for a fuel cell used, for example, in cellular phones, portable equipment such as personal computers, home use fuel cells, and fuel cell for fuel cell vehicles, a manufacturing method thereof, and a target material for sputtering, as well as a metal separator and a fuel cell.

BACKGROUND ART

A fuel cell is constituted by putting a solid polymer electrolyte film between an anode electrode and a cathode electrode to form a unit cell and stacking a plurality of unit cells by way of an electrode referred to as a separator (or bipolar plate).

For the material constituting the separator for use in the fuel cell, a low contact resistance and a property that the low contact resistance is maintained for a long time during use as the separator. For this purpose, application of metal materials such as aluminum alloys, stainless steels, nickel alloys, and titanium alloys has been investigated so far in view of fabricability and strength.

Further, it has been said that the inside of a fuel cell is an acidic corrosive environment at pH of 2 to 4, and corrosion resistance (acid resistance) of maintaining the low contact resistance even in the corrosion environment is also required for the material used for the separator.

Since metals such as stainless steel or titanium show good corrosion resistance due to their passivation films on the surface, they have been investigated as materials for the separator of the fuel cell. However, since the passivation film has a high electric resistance, when a metal such as stainless steel or titanium is used for the separator of the fuel cell, electroconductivity may possibly be degraded remarkably by the passivation film formed on the surface thereof in the corrosion environment. Accordingly, even if the contact resistance at the initial stage of use is low, the low contact resistance can not be maintained for a long time during use as the separator and the contact resistance increases with time, which results in loss of current. Further, it is also a problem, for example, that the electrolyte film is deteriorated by metal ions that dissolve from the corroded material.

In view of such problems, in order to suppress increase in the contact resistance and maintaining the electroconductivity for a long time, various kinds of metal separators have been proposed so far. For example, those prepared by gold plating on the surface of a metal separator such as stainless steel or titanium (Patent Document 1), those prepared by removing oxide films on the surface of a substrate comprising, for example, stainless steel and titanium and then depositing a noble metal or a noble metal alloy (Patent Document 2), or those prepared by coating the surface of a stainless steel substrate with a corrosion resistant metal film and coating a noble metal film thereon (Patent Document 3) have been proposed.

[Patent Document 1] JP-A No. 10-228914
[Patent Document 2] JP-A No. 2001-6713
[Patent Document 3] JP-A No. 2001-93538

DISCLOSURE OF THE INVENTION

However, the separator materials of the inventions described in JP-A No. 10-228914, JP-A No. 2001-6713, or JP-A No. 2001-93538 involve drawback, for example, that no sufficient corrosion resistance can be provided due to peeling of films or dissolving of metal ions from substrates during their use as separators, the contact resistance can not be lowered and, further, even when low contact resistance is shown in the initial stage of use the low contact resistance cannot be maintained over a long time in the corrosive environment of fuel cells. Further, when a film is coated by existent plating, etc., that involves drawbacks, since it takes much time for removing the passivation film or requires complicate steps, it has been a drawback of deteriorating the productivity.

In view of the above, the subject of the present invention is to provide an alloy film for a metal separator for a fuel cell, which has excellent corrosion resistance, low contact resistance, capability for maintaining the low contact resistance for a long time also in a corrosive environment and, further, excellent productivity, and also provide a manufacturing method thereof and a target material for sputtering, as well as a metal separator and a fuel cell.

That is, the present invention provides the following (1) to (18).

(1) An alloy film for a metal separator for a fuel cell containing at least one noble metal element selected from Au and Pt, and at least one non-noble metal element selected from the group consisting of Ti, Zr, Nb, Hf, and Ta, in which the content ratio of the noble metal element/non-noble metal element is from 35/65 to 95/5 by atomic ratio, and the film thickness is 2 nm or more.

(2) A method of manufacturing an alloy film for a metal separator for a fuel cell including:
a disposition step of disposing a metal substrate in a chamber of an apparatus for practicing a sputtering method; and
a film deposition step of forming an alloy film containing at least one noble metal element selected from Au and Pt and at least one non-noble metal element selected from the group consisting of Ti, Zr, Nb, Hf, and Ta at a content ratio of the noble metal element/non-noble metal element of from 35/65 to 95/5 by atomic ratio and having a film thickness of 2 nm or more by a sputtering method on at least a portion of the surface of the metal substrate disposed in the disposition step.

(3) A method of manufacturing an alloy film for a metal separator for a fuel cell according to (2) described above, further including a heat treatment step of further heat treating the metal substrate formed with the alloy film after the film deposition step.

(4) A method of manufacturing an alloy film for a metal separator for a fuel cell as described in (3) above, wherein the temperature of the heat treatment in the heat treatment step is from 150 to 800° C.

(5) A method of manufacturing an alloy film for a metal separator for a fuel cell as described in (4) above, wherein the heat treatment is performed in an atmosphere having an oxygen partial pressure of $2.1 \times 10^4$ Pa or lower.

(6) A method of manufacturing an alloy film for a metal separator for a fuel cell as described in (2) above, wherein the film deposition step is performed while heating the metal substrate at 150 to 800° C.

(7) An alloy film for a metal separator for a fuel cell manufactured by the manufacturing method as described in any one of (2) to (6) above.

(8) A metal separator for a fuel cell obtained by coating the surface of the metal substrate with the alloy film for the metal separator as described in (1) or (7) above.

(9) A metal separator for a fuel cell as described in (8) above, wherein the metal substrate is formed in at least a portion on the surface thereof with a concave portion for forming a gas flow channel that allows a gas to pass therethrough.

(10) A metal separator for a fuel cell as described in (8) or (9) above, wherein the metal substrate comprises at least one metal selected from the group consisting of titanium, titanium based alloys, aluminum, aluminum based alloys, and stainless steels.

(11) A method of manufacturing a metal separator for a fuel cell including:

a disposition step of disposing a metal substrate in a chamber of an apparatus for practicing the sputtering method; and a film deposition step of coating the surface of the metal substrate disposed in the disposition step with an alloy film containing at least one noble metal element selected from Au and Pt and at least one non-noble metal element selected from the group consisting of Ti, Zr, Nb, Hf, and Ta at a content ratio of the noble metal element/non-noble metal element of from 35/65 to 95/5 by atomic ratio and having a film thickness of 2 nm or more by a sputtering method.

(12) A method of manufacturing a metal separator for a fuel cell described in (11) above, including a forming step of forming a concave portion for forming a gas flow channel for allowing a gas to pass therethrough in at least a portion on the surface of the metal substrate before the disposition step.

(13) A method of manufacturing metal separator for a fuel cell described in (11) or (12) above, further including a heat treatment step of heat treating the metal substrate formed with the alloy film after the film deposition step.

(14) A method of manufacturing a metal separator for a fuel cell as described in (13) above, wherein the temperature of the heat treatment is from 150 to 800° C.

(15) A method of manufacturing a metal separator for a fuel cell as described in (14) above, wherein the heat treatment is performed under an atmosphere having an oxygen partial pressure of $2.1 \times 10^4$ Pa or lower.

(16) A method of manufacturing the metal separator for a fuel cell as described in (11) above, wherein the film deposition step is performed by heating the metal substrate at 150 to 800° C.

(17) A fuel cell containing the metal separator for a fuel cell as described in any one of (8) to (10) above.

(18) A target material for sputtering used for manufacturing an alloy film for a metal separator for a fuel cell, comprising at least one noble metal element selected from Au and Pt and at least one non-noble metal element selected from the group consisting of Ti, Zr, Nb, Hf, and Ta and the atomic ratio between both of them (noble metal element/non-noble metal element) is from 35/65 to 95/5.

In the alloy film for a metal separator for a fuel cell according to (1) described above, by alloying of Au and Pt which are elements not forming an oxide film on the surface thereof in a corrosion environment among metal elements referred to as noble metals with non-noble metal elements selected from Ti, Zr, Nb, Hf, and Ta which are excellent in corrosion resistance and liable to be bonded with oxygen, nitrogen, and carbon, the amount of the expensive noble metals used can be suppressed, cohesion of Au or Pt can be prevented, and adhesion to a metal substrate can be increased and, by defining the content ratio of the noble metal element/non-noble metal element to a predetermined range, good electroconductivity and corrosion resistance can be provided for a long time even in a high temperature and corrosion environment. Further, by defining the film thickness to 2 nm or more, formation of pinholes can be prevented to inhibit exposure of the substrate as the surface film of the metal separator for the fuel cell, and formation of passivation film which has high electric resistance can be suppressed. Further, corrosion of the substrate and dissolving of metal ions from pinhole portions can also be prevented.

According to the manufacturing method of the alloy film for the metal separator for a fuel cell according to (2) described above, by forming a film containing at least one noble metal element selected from Au and Pt and at least one non-noble metal element selected from the group consisting of Ti, Zr, Nb, Hf, and Ta by a sputtering method on at least a portion of the surface of the metal substrate by film deposition step, the amount of the expensive noble metal used can be suppressed and an alloy film for the metal separator having both electroconductivity and corrosion resistance can be manufactured at a low cost. Further, by performing the film deposition step by the sputtering method, the content ratio between the noble metal element and the non-noble metal element in the formed alloy film can be controlled stably, as well as an extremely thin film of about 2 nm can be deposited uniformly as a dense film.

According to the manufacturing method of the alloy film for the metal separator for a fuel cell according to (5) described above, electroconductivity and corrosion resistance of the obtained alloy film can be enhanced by controlling the oxygen partial pressure in the heat treatment step to an oxygen partial pressure of $2.1 \times 10^4$ Pa or lower depending on the content ratio of the noble metal element and the non-noble metal element in the alloy film.

In the manufacturing method of the alloy film for the metal separator for a fuel cell according to (6) described above, the productivity can be improved further since the film deposition and the heat treatment can be performed in one identical apparatus by performing deposition while heating the metal substrate at 150 to 800° C.

Since the alloy film for the metal separator for a fuel cell according to (7) described above is manufactured by the manufacturing method according to any one of (2) to (6) described above, the amount of the expensive noble metal used can be suppressed, and it has both the electroconductivity and the corrosion resistance and can be manufactured at a low cost.

The metal separator for the fuel cell according to (8) described above can provide good conductivity and corrosion resistance for a long time even in a high temperature and corrosion environment by having the alloy film for the metal separator according (1) or (7) described above formed on the surface of the metal substrate.

The metal separator for a fuel cell according to (9) above can provide good electroconductivity and corrosion resistance for a long time even in a high temperature and corrosion environment by having the alloy film for the metal separator stacked to at least a portion on the surface of the metal substrate having a concave portion for forming a gas flow channel.

In the metal separator for a fuel cell according to (10) described above, since titanium, titanium based alloys, aluminum, aluminum based alloys, and stainless steels thereof have good corrosion resistance and are excellent also in fabricability, they are suitable metal materials for the separator of the fuel cell.

In the manufacturing method of the metal separator for a fuel cell according to (11) described above, a metal separator of excellent electroconductivity and corrosion resistance can be manufactured by coating the surface of the metal substrate with the alloy film by the film deposition step.

In the manufacturing method of the metal separator for a fuel cell according to (12) described above, since the alloy film for the metal separator is coated to at least a portion on the surface of the metal substrate having the concave portion for forming the gas flow channel, a metal separator capable of providing good electroconductivity and corrosion resistance for a long time even in a high temperature corrosion environment can be manufactured for the metal substrate formed with a concave portion.

In the manufacturing method of the metal separator for a fuel cell according to (13) or (14) described above, when the metal substrate coated with the alloy film is heat treated by the heat treatment step described above, a metal separator further excellent in electroconductivity and corrosion resistance can be manufactured.

In the manufacturing method of the metal separator for a fuel cell according to (15) described above, the electroconductivity and the corrosion resistance of the obtained alloy film can be improved by controlling the oxygen partial pressure to $2.1 \times 10^4$ Pa or lower depending on the content ratio between the noble metal element and the non-noble metal element in the alloy film.

In the manufacturing method of the metal separator for a fuel cell according to (16) described above, the productivity can be enhanced further since the film deposition and the heat treatment can be performed at the same time in one identical apparatus by performing the film deposition while heating the metal substrate at 150 to 800° C.

Since the fuel cell according to (17) described above uses the metal separator for a fuel cell according to one of (8) to (10) above, it has good corrosion resistance and electroconductivity.

The target material for sputtering according to (18) described above can manufacture an alloy film of a desired film composition stably at high productivity by using it for the manufacture of the alloy film for the metal separator for a fuel cell.

Since the alloy film for the metal separator for a fuel cell according to the invention has low contact resistance, it is excellent in electroconductivity. Further, since it is excellent in corrosion resistance, low contact resistance can be maintained for a long time even in a corrosive environment.

Further, the manufacturing method of the alloy film for the metal separator according to the invention can manufacture the metal separator alloy film excellent in electroconductivity and corrosion resistance with good reproducibility for a film composition and good productivity by coating the same by a sputtering method using an alloy target.

Further, since the metal separator for a fuel cell according to the invention is excellent in electroconductivity and corrosion resistance and further excellent in productivity since it has the alloy film for the metal separator on the surface.

Further, the manufacturing method of the metal separator for a fuel cell according to the invention can manufacture the alloy film for the metal separator with excellent electroconductivity and corrosion resistance and while maintaining good reproducibility for a film composition and good productivity by forming it on the surface of the metal substrate by a sputtering method using an alloy target.

Furthermore, the fuel cell according to the invention has good corrosion resistance and electroconductivity since it uses the metal separator described above.

Further, the sputtering target material of the invention can stably manufacture an alloy film of a desired fuel composition at a high productivity upon manufacturing the alloy film for the metal separator for a fuel cell described above.

BRIEF DESCRIPTION OF THE DRAWINGS

FIG. 2 (A) is a plan view for a metal separator for a fuel cell according to the invention, (B) is a fragmentary enlarged cross-sectional view for the metal separator for a fuel cell.

DESCRIPTION OF REFERENCES

Figure 1:
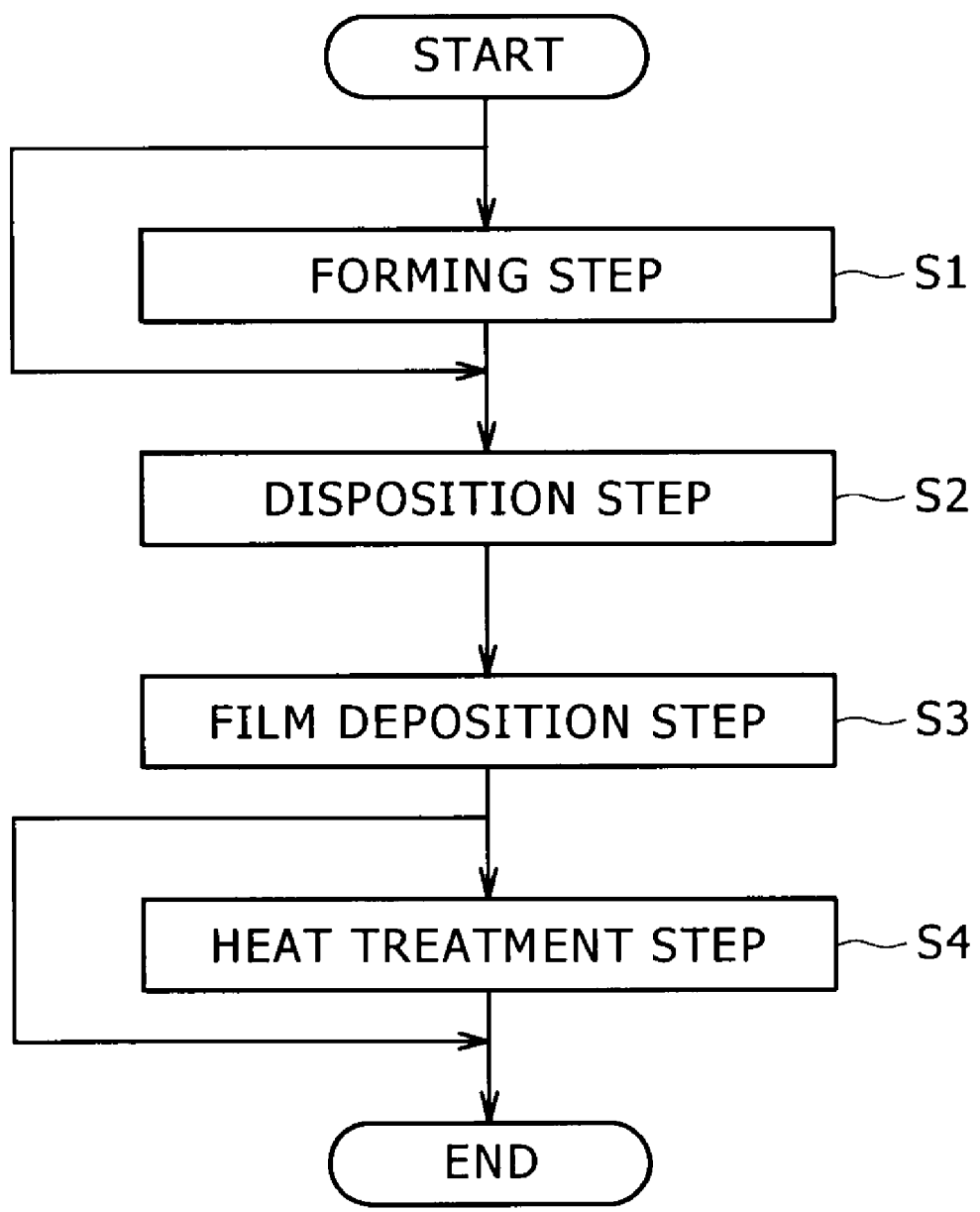
FIG. 1 is a flow chart for explaining the steps of a manufacturing method for a metal separator for a fuel cell according to the invention.

S1 forming step
S2 disposition step
S3 film deposition step
S4 heat treatment step
1, 31 metal separator
2 metal substrate
3 alloy film
10 unit cell
20 fuel cell
21 gas flow channel
22 gas introduction port
32 solid polymer film
33 carbon cloth
41 specimen
42 carbon cloth
43 copper electrode
44 DC current power source
45 voltmeter

BEST MODE FOR CARRYING OUT THE INVENTION

Figure 3:
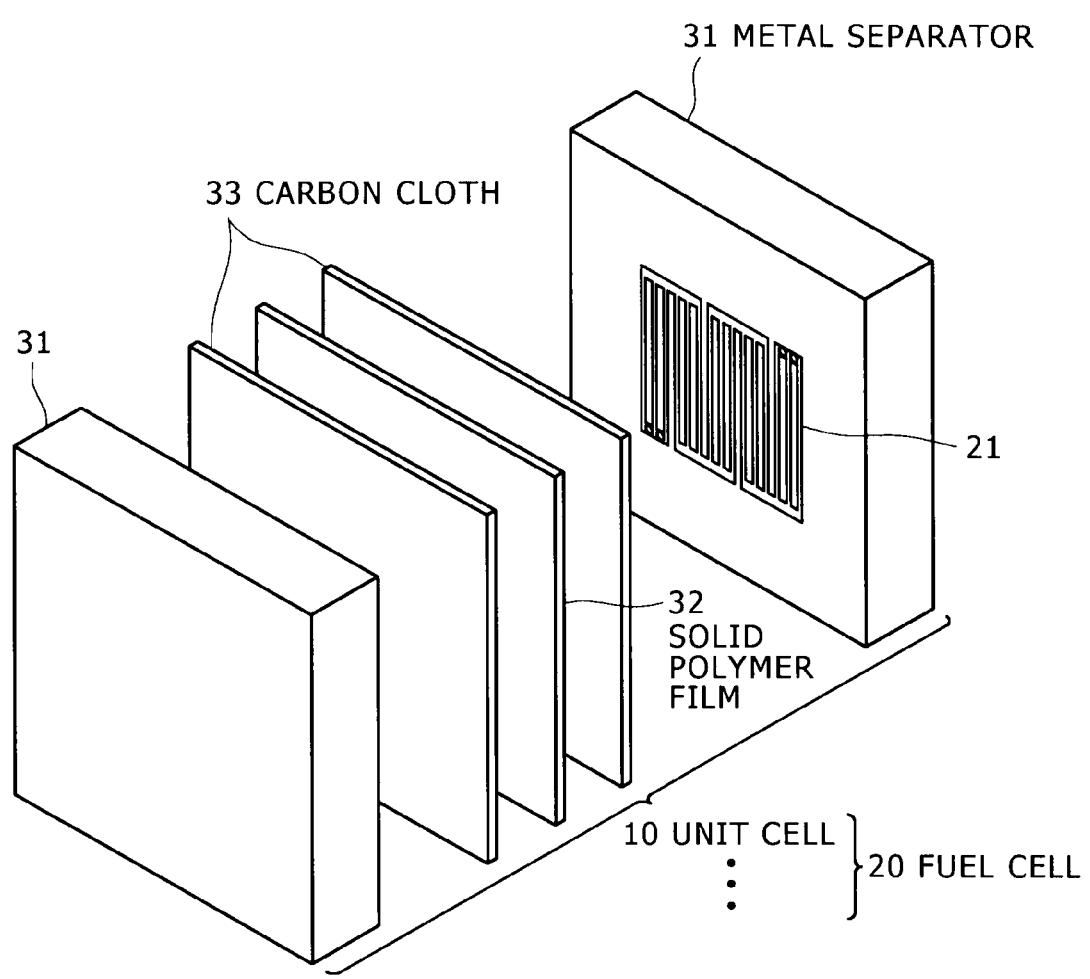
FIG. 3 is an exploded perspective view for explaining the constitution of a fuel cell using a separator of a fuel cell according to the invention.
Figure 4:
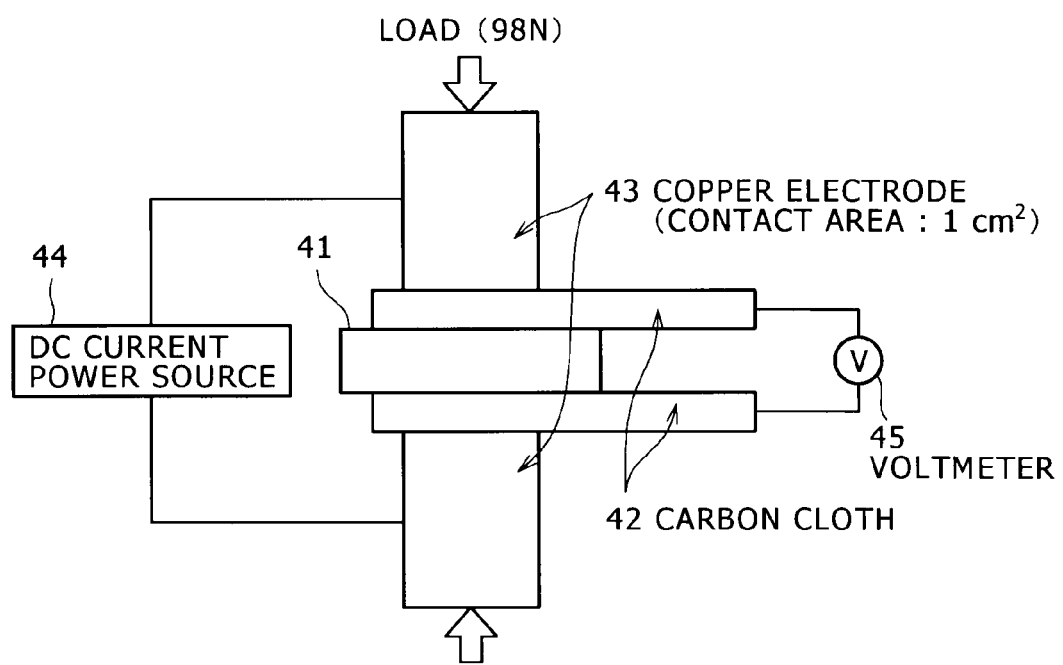
FIG. 4 is a view for explaining a method of measuring contact resistance.

Description is to be made optionally with reference to the drawings to an alloy film for a metal separator for a fuel cell and a manufacturing method thereof, embodiment for a metal separator for a fuel cell and a fuel cell, and a sputtering target material used for the film deposition of the alloy film according to the invention. In the drawings referred to, FIG. 1 is a flow chart for explaining the steps of a manufacturing method for a separator of a fuel cell according to the invention. In FIG. 2, (A) is a plan view for a separator of a fuel cell according to the invention, and (B) is a fragmentary enlarged cross sectional view thereof. FIG. 3 is a view showing the state of developing a portion of a fuel cell using a separator of a fuel cell according to the invention. FIG. 4 is a view for explaining a method of measuring contact resistance.

An alloy film for a metal separator for a fuel cell according to the invention (refer to FIG. 2(B). Hereinafter, sometimes it is referred to simply as "alloy film") 3 comprises an alloy containing a noble metal element and a non-noble metal element.

As the noble metal element in the alloy film 3, at least one element selected from Au and Pt is used since this is a metal not forming an oxide film on the surface thereof in a corrosion environment, capable of favorably maintaining electroconductivity also in a corrosion environment, and excellent in the corrosion resistance.

Further, as the non-noble metal element, at least one element selected from the group consisting of Ti, Zr, Nb, Hf, and Ta is used since this is a metal of forming a passivation film on the surface thereof to exhibit good corrosion resistance and liable to be bonded with oxygen, nitrogen, and carbon. The alloy film 3 containing the non-noble metal element having the good corrosion resistance and the noble metal element has both good electroconductivity and corrosion resistance and, further, the amount of the noble metal element used can be reduced and adhesion with the metal substrate 2 and can be improved and cohesion of the film can be prevented by using at least one element selected from Ti, Zr, Nb, Hf, and Ta.

In the alloy film 3 for the metal separator for a fuel cell according to the invention, the content ratio of the noble metal element/non-noble metal element is from 35/65 to 95/5 by atomic ratio, more preferably, 35/65 to 85/15 by atomic ratio and, further preferably, from 35/65 to 80/20. Usually, when a film only consisting of a noble metal such as Au or Pt is formed thinly on a substrate, cohesion of the noble metal occurs in a high temperature and corrosion environment (for example, in 1 mol/L sulfuric acid at 80° C.), in which a portion of the substrate is exposed to cause dissolution of the substrate and then the film of the noble metal may possibly be peeled from the substrate. On the contrary, in the alloy film 3 of the invention, cohesion of the film containing Au or Pt can be prevented and good electroconductivity and corrosion resistance can be provided for a long time even in a high temperature and corrosion environment by alloying of the noble metal element such as Au or Pt with the highly corrosive non-noble metal element.

When the content ratio of the noble metal element exceeds 95% by atomic ratio, cohesion in a high temperature and corrosion environment can not be suppressed sufficiently but cohesion of the alloy film 3 occurs, when exposed for a long time in the high temperature and corrosion environment to expose the metal substrate 2 and dissolution of the metal substrate 2 or peeling of the alloy film 3 may possibly be caused. Further, a thick oxide film may be formed at the surface of the exposed portion on the substrate and at the boundary between the alloy film 3 and the metal substrate 2 in the periphery thereof to possibly deteriorate the electroconductivity. On the other hand, when the content ratio of the noble metal element is less than 35% by atomic ratio, while cohesion of the alloy film 3 does not occur, the area ratio and the thickness of the oxide film formed on the surface of the alloy film 3 increase to possibly deteriorate the electroconductivity.

It is necessary that the thickness of the alloy film 3 for the metal separator of the invention is 2 nm or more. When the thickness of the alloy film 3 is less than 2 nm, since many pinholes are formed in the alloy film 3, to result a portion where the metal substrate 2 is exposed and a thick oxide film is formed on the surface of the exposed portion and at the boundary between the alloy film 3 and the metal substrate 2 when used as the separator to possibly deteriorate the electroconductivity. Further, the thickness of the alloy film 3 is preferably 5 nm or more and, particularly preferably, 7 nm or more. On the other hand, while the upper limit of the thickness of the alloy film 3 is not particularly limited, it is preferably 500 nm or less in view of the time and the cost required for film deposition.

The manufacturing method of the alloy film for the metal separator for a fuel cell according to the invention is a method of including the disposition step S2 and the film deposition step S3 and, more preferably, includes a heat treatment step S4 thereafter in the manufacturing method for the metal separator for a fuel cell according to the invention. The film deposition step S3 and the heat treatment step S4 are to be explained in the manufacturing method of the alloy film for the metal separator for a fuel cell to be described later.

Then, a method of manufacturing a metal separator for a fuel cell of the invention is to be described.

As shown in FIG. 1, the manufacturing method for the metal separator 1 of a fuel cell according to the invention is a method including a disposition step S2 and a film deposition step S3 and, more preferably, including a heat treatment step S4 thereafter. Further, a forming step S1 may be included before the disposition step S2. Now description is to be made to a manufacturing method for the metal separator 1 of the fuel cell including the forming step S1.

In the forming step S1, a concave portion is formed to at least a portion on the surface of a metal substrate 2 for forming a gas flow channel 21 (refer to FIG. 2(A)) for allowing a gas such as a hydrogen gas or air to flow therethrough. In this case, the surface of the metal substrate 2 means a surface defining the outer side of the metal substrate 2, which includes so-called surface, rear face, and lateral surface. Prior to the forming step S1, it is preferred to previously form the metal substrate 2 into a predetermined dimension or shape with respect to the longitudinal length, lateral width, thickness, etc.

In this case, an apparatus for forming the gas flow channel 21 to at least a portion on the surface of the metal substrate 2 is not particularly limited and any apparatus known so far capable of attaining a predetermined purpose can be used optionally.

Further, when the forming step S1 is not performed, a metal separator for a fuel cell comprising a metal substrate with a flat surface not formed with the concave portion on the surface can be manufactured.

As the metal substrate 2, pure titanium or Ti alloys such as Ti—Al, Ti—Ta, Ti-6Al-4V, and Ti—Pd, etc. according to JIS H 4600, classes 1 to 4, stainless steels such as SUS304 or SUS316, and aluminum materials such as pure aluminum or aluminum alloys can be used. While aluminum materials and stainless steels are superior in view of the cost, pure titanium or titanium alloy is advantageous in view of the corrosion resistance. Further, use of pure titanium or titanium alloy is preferred with a view point of preventing deterioration of the solid polymer film of a fuel cell caused by Fe ions that slightly dissolve from the stainless steel.

The disposition step S2 is a step of disposing the metal substrate 2 formed with the concave portion in the forming step S1 at a predetermined position in a chamber of an apparatus for practicing the sputtering method. It will be apparent that also the sputtering target material according to the invention described above is disposed at a predetermined position in the chamber of the apparatus in this disposition step S1.

The film deposition step S3 is a step of coating the surface of the metal substrate 2 (entire surface or a portion of the surface of the metal substrate 2) in which the concave portion is formed and which is disposed in the chamber of the apparatus for practicing the sputtering method in the disposition step S2, with an alloy film 3 containing at least one noble metal element selected from Au and Pt and at least one non-noble metal element selected from Ti, Zr, Nb, Hf, and Ta (refer to FIG. 2(B)). Further, in the manufacturing method for the metal separator for a fuel cell according to the invention, a surface layer such as a passivation film formed by the manufacturing step of the metal substrate 2 may be removed before the film deposition step S3 for the alloy film.

In the film deposition step S3, film deposition of the alloy film 3 containing the noble metal element and the non-noble metal element is performed by a sputtering method. Film deposition by the sputtering method has an advantage capable of performing at a temperature from room temperature to several hundreds ° C., decreasing damages in the metal substrate 2, and depositing uniformly a dense film stably.

Further, the content ratio between the noble metal element and the non-noble metal element can be controlled easily in a wide range by the sputtering method, and the film thickness can also be controlled easily. While the alloy film 3 can be coated, for example, also by plating, this involves disadvantages such that the content ratio is restricted depending on the combination of the noble metal element and the non-noble metal element and the concentration control for the noble metal element and the non-noble metal element in a plating solution is complicated to lack in the practicality with an industrial point of view. On the other hand, the sputtering method has an advantage capable of easily changing the content ratio with no restriction.

As described above, after deciding a preferred content ratio between the noble metal element and non-noble metal element based on the investigation of composition of the alloy film of which the content ratio and the film thickness are controlled over a wide range, an alloy film 3 with a stable composition can be obtained with an alloy target manufactured at the content ratio decided above investigation.

In the film deposition step S3 by the sputtering method for the alloy film 3, it is preferred to coat the alloy film 3 while heating the metal substrate 2 at 150 to 800° C. By such a method, since the heat treatment can be performed simultaneously in one identical apparatus, the productivity is improved.

The film deposition by the sputtering method is performed preferably under the conditions in an argon gas atmosphere and at a pressure of 0.133 to 1.33 Pa.

In the alloy film 3, while the microstructure in the alloy film 3 has not yet been apparent completely, this may include an alloy phase in which the composition is equivalent with the ratio shown as the content ratio of noble metal element/non-noble metal element in the alloy film (herein after referred to as an average composition of the alloy film 3), as well as a phase in which the noble metal element is enriched more than the average composition of the alloy film 3 (noble metal element rich phase) and a phase in which a non-noble metal element is enriched (non-noble metal element rich phase).

When the non-noble metal rich phase is exposed to the surface, an oxide film is formed (including passivation film) from the surface to the inside at the portion, and it provides an excellent corrosion resistance. While the portion may be considered to be poor in the electroconductivity, it is considered that the electroconductivity of the alloy film can be ensured since the noble metal element rich phase which is excellent in the corrosion resistance and less forming the oxide film is exposed to the surface. As a result, both the corrosion resistance and the electroconductivity of the alloy film can be provided. Further, since the noble metal element rich phase is buried in the less cohesive non-noble metal element rich phase or in the oxide film formed therein, it is considered that this is less cohesive and detaching, and capable of maintaining the electroconductivity for a long time.

The alloy film 3 of the invention has sufficient electroconductivity and corrosion resistance already up to the film deposition step S3, more excellent characteristics can be obtained by adding the heat treatment step S4.

The temperature for the heat treatment in the heat treatment step S4 is preferably 150° C. or higher. Reducing the thickness of the boundary layer such as the passivation film present between the alloy film 3 and metal substrate 2, leads to improving the electroconductivity. The film stress in the alloy film 3 is moderated, and/or atom diffusion occurs between the alloy film 3 and the metal substrate 2 to improve the adhesion. Further, it has an advantage of forming an oxide film to a portion that undergoes less deposition of the alloy film 3 such as the end face of the metal substrate 2 to improve the corrosion resistance for the portion.

On the other hand, when the heat treatment temperature exceeds 800° C., it is considered that excellent contact resistance can be obtained no more due to the reasons, for example, that the area ratio of the oxide film formed on the surface of the non-noble metal element rich phase occupying the surface of the alloy film 3 is increased and the thickness of the oxide film is increased to deteriorate the electroconductivity and/or the corrosion resistance is deteriorated due to the cohesion of the alloy film 3. Accordingly, the heat treatment temperature in the heat treatment step S4 is preferably from 150° C. to 800° C. The heat treatment temperature is, more preferably, from 150° C. to 650° C. and, most preferably, from 200 to 650° C.

In the invention, when the layer formed between the metal substrate 2 and the alloy film 3 (boundary layer (not illustrated)) has good adhesion, electroconductivity, and corrosion resistance together, the same effect can be obtained.

Further, since the non-noble metal (Ti, Zr, Nb, Hf, Ta) in the alloy film of the invention is liable to bond with nitrogen or carbon as well as with oxygen, excellent adhesion can be obtained even when carbide or nitride is present on the surface of the metal substrate 2 in the same manner as in the case where the passivation film is present.

That is, in the invention, the same effect can be obtained in a case where the boundary layer comprises an oxide (including passivation film), nitride, oxynitride, oxycarbide, carbonitride, oxycarbonitride containing one or more of elements selected from Zr, Hf, Nb, Ta, and Ti, as well as a mixture of two or more kinds of materials selected from them. Such a boundary layer can be formed by depositing a film as the boundary layer by a PVD method (sputtering method, vacuum vapor deposition method, ion plating method, etc.) and then depositing the alloy film 3. Further, when the boundary layer is derived from the surface layer of the metal substrate 2 before the alloy film 3 deposition, same effect can be obtained. The surface layer may also be a surface layer formed by a method of obtaining the same by hot work finishing or cold work finishing, a method of forming a passivation film by pickling, a method of forming an anodized film by anodization, a method of forming an oxide film by a heat treatment in an atmospheric air or in an atmosphere where oxygen is present, as well as other usual surface treatment methods.

As a matter of fact, excellent electroconductivity, adhesion, and corrosion resistance can be obtained also in a case where the boundary layer such as an oxide film is not present. Further, generation of pinholes can be suppressed and the adhesion and the durability can be improved more when the surface of the metal substrate 2 before film deposition is smooth.

The heat treatment step S4 is preferably performed in an atmosphere having an oxygen partial pressure of $2.1 \times 10^4$ Pa or lower (oxygen partial pressure in an atmospheric air or lower). The oxygen partial pressure referred to in the invention means a pressure of oxygen occupying in a heat treatment furnace for performing the heat treatment step S4 (in the invention, it is assumed that the composition of atmospheric air comprises nitrogen and oxygen about at 4:1 ratio). For example, when the thickness of the alloy film 3 is relatively thin as 3 to 5 nm, it is preferred to perform the heat treatment in an atmosphere where the oxygen partial pressure is lower than the oxygen partial pressure in the atmospheric air for a short time of about 1 to 15 min. When the alloy film 3 is 50 nm or more, a preferred result is obtained also by a heat treatment in an atmospheric air for about 10 to 50 min. Further, it is preferred to appropriately control the oxygen pressure, the temperature, and the time depending on the thickness of the alloy film 3 and the content ratio of the noble metal element, for example, such that more excellent electroconductivity and corrosion resistance can be obtained as the oxygen partial pressure is lower in a case of heat treating the alloy film 3 with the content of the noble metal element within a range of about 5 to 25% by atomic ratio at a high temperature (for example, 500° C.). Even under a low oxygen partial pressure condition, the alloy film can provide corrosion resistance while ensuring the electroconductivity, since the oxide film is formed at the surface of the non-noble metal element rich phase exposed to the surface of the alloy film 3 at an actually attainable vacuum degree. The oxygen partial pressure is preferably 13.33 Pa or lower and, more preferably, 1.33 Pa or lower.

The heat treatment step S4 can be performed with a known heat treatment furnace such as an electric furnace or a gas furnace capable of reducing the pressure in the furnace.

Since the fuel cell separator 1 manufactured by the manufacturing method of the invention has the alloy film 3 satisfying the electroconductivity and the corrosion resistance on the surface of the metal substrate 2 as described above, it can be used suitably as a metal separator for a fuel cell.

Then, the separator 1 of the fuel cell according to the invention manufactured by the manufacturing method for the separator of the fuel cell of the invention described above is to be explained specifically.

As shown in FIGS. 2(A) and (B), the metal separator 1 of the fuel cell according to the invention has a structure in which the alloy film 3 for the metal separator of the invention described above is formed on the surface of a metal substrate 2 with a concave portion at least to a portion on the surface for the gas flow channel 21 that allows a gas to pass therethrough.

Then, the fuel cell according to the invention is to be described optionally with reference to the drawings.

As shown in FIG. 3, a fuel cell 20 according to the invention has a structure of stacking a plurality of unit cells 10 each having a structure in which a solid polymer film 32 is put between two sheets of carbon cloths 33, 33 and, further, metal separators 31, 31 of fuel cells of the invention described above are stacked to the outside of the carbon cloths 33, 33.

In the fuel cell 20, metal substrates 2 made of, for example, titanium or a titanium alloy are provided by a predetermined number, the metal substrate 2 provided by the predetermined number are formed each into a predetermined size such as 95.2 mm length×95.2 mm width×19 mm thickness, and a gas flow channel 21 of a shape as shown in FIG. 3 is fabricated by forming a concave portion, for example, of 0.6 mm groove width and 0.5 mm groove depth to the central portion on the surface of the substrate 2 by machining, etching, or the like. Then, the metal separators 1 of the fuel cell can be manufactured by the predetermined number by performing the film deposition step S3 and the heat treatment step S4 described above by using the metal substrates 2 formed with the concave portion.

Then, as shown in FIG. 3 the separators 31 of the fuel cell manufactured by the predetermined number, for example, by the number of two are disposed with their surfaces which have the gas flow channel 21 opposed to each other, a gas diffusion layer comprising a carbon cloth 33, etc. for uniformly dispersing the gas on the film is disposed to each surface with the gas flow channel 21, and a solid polymer film 32 with a platinum catalyst on the surface is put between one gas diffusion layer and the other gas diffusion layer to form a unit cell 10. A plurality of unit cells 10 manufactured in the same manner are plurally stacked to form a cell stack (not illustrated), to which other predetermined parts necessary for a fuel cell are attached and connected, thereby capable of manufacturing a fuel cell (solid polymer type fuel cell) 20 according to the invention having good corrosion resistance and electroconductivity.

As the solid polymer film 32 used for the fuel cell 20, any film can be used with no particular restriction so long as the film has a function of transferring protons formed on a cathode electrode to an anode electrode and, for example, a fluoro type polymer film having sulfonic groups can be used suitably.

In the thus manufactured fuel cell 20, a fuel gas (for example, a hydrogen gas at 99.999% purity) is introduced by way of a gas flow channel to the metal separator 31 of the fuel cell disposed as the anode electrode and air is introduced by way of the gas flow channel to the metal separator 31 of the fuel cell disposed as the cathode electrode. In this case, it is preferred that the fuel cell 20 is entirely heated and kept at a temperature of about 80° C. and the hydrogen gas and air are passed through a heated water to adjust the dew point temperature to about 80° C. Further, the fuel gas (hydrogen gas) and air are preferably introduced at a pressure, for example, of 2026 hPa (2 atm).

In the fuel cell 20, by introducing the hydrogen gas to the anode electrode as described above, it is uniformly supplied through the gas diffusion layer to the solid polymer film 32 where the reaction of the following formula (1) is taken place.

$$H_2 \rightarrow 2H^+ + 2e^- \tag{1}$$

On the other hand, in the fuel cell 20, air is introduced to the cathode electrode and is supplied uniformly through the gas diffusion layer to the solid polymer film 32 and the reaction of the following equation (2) is taken plate in the solid polymer film 32.

$$4H^+ + O_2 + 4e^- \rightarrow 2H_2O \tag{2}$$

As described above, by the occurrence of the reaction of the formulae (1), (2) in the solid polymer film 32, a voltage at about 1.2 V can be obtained theoretically.

In this case, since the fuel cell 20 according to the invention uses the metal separator 1 of the fuel cell according to the invention it can provide good corrosion resistance and electroconductivity compared with fuel cells using existent metal separators.

The target material for sputtering according to the invention (not illustrated) comprises at least one noble metal element selected from Au and Pt and at least one non-noble metal element selected from the group consisting of Ti, Zr, Nb, Hf, and Ta such that the atomic ratio between them (noble metal element/non-noble metal element) is from 35/65 to 95/5 for coating the alloy film 3 for the metal separator for a fuel cell. In a small-scale production, while the composition of an alloy film can be changed with sputtering target prepared by bonding a chip of a non-noble metal element on a surface of a noble metal element target, or bonding a chip of a noble metal element on a surface of a non-noble metal element target, the reproducibility of the alloy composition of the deposited film may sometimes be worsened. Accordingly, for coating a great amount of alloy films in mass production of the alloy films 3 for the metal separator, it is preferred to experimentally investigate the composition and then depositing the alloy film 3 by manufacturing an alloy target of a predetermined composition.

Depending on the type of the element constituting the alloy, deviation between the alloy target composition and the alloy film composition may sometimes be caused. This is considered to be mainly attributable to that each of atoms is scattered by collision against an Ar ion and driven out of the metal substrate 2 depending on the type of the element during movement from the surface of the target material to the metal substrate 2 during sputtering. However, it is considered that such scattering less occurs in the noble metal element and the non-noble metal element selected in the invention and that the alloy film 3 of the composition identical with that of the target material is obtained.

While the target material for sputtering according to the invention can be manufactured by a powder metallurgical method or a melting method, since it is difficult to manufacture by the melting method in a case where there is a significant difference for the melting point or the specific gravity between the noble metal element and non-noble metal element to be combined or in a case of combination of elements which have less solid solubility to each other, it is preferably manufactured by the powder metallurgical method. In this case, it can be manufactured by a process of "mixing of starting powder→mold charging→mold degassing→HIP (hot isostatic press) sintering→demolding→forging→rolling→machining→bonding to backing plate".

When such a target material for sputtering is used, an alloy film 3 of stable film composition can be deposited and the metal separator 31 for the fuel cell and the fuel cell 20 which have stable performance can be provided.

EXAMPLE

An alloy film for a metal separator for a fuel cell according to the invention and a manufacturing method thereof, a metal separator, as well as a fuel cell are to be described specifically in comparison between examples satisfying the necessary conditions of the invention and comparative examples not satisfying the necessary conditions of the invention.

Examples 1 to 8, Comparative Examples 1 to 7

After supersonically cleaning in acetone, a substrate made of pure titanium according to JIS H 4600 class-1 (20×50×0.15 mm, arithmetical mean roughness (Ra)=15 nm), was attached to a substrate bed in a chamber. Then, after attaching a target bonded with a chip of a non-noble metal element on a surface of a noble metal element target, or a chip of a noble metal element on a surface of a non-noble metal element target (which target to use depends on the content ratio between the noble metal element and the non-noble metal element (indicated as "noble metal element/non-noble metal element content ratio in Tables 1 to 5 (atomic ratio)), as a alloy film forming target, to the electrode in the chamber, the inside of the chamber was evacuated to 0.00133 Pa or lower.

In this case, the surface roughness of the substrate was measured by using surface profiler (Dektak 6M) and Ra was calculated by selecting a range for 20 μm from the roughness curve obtained by the measurement.

Then, an Ar gas was introduced into the chamber and controlled such that the pressure in the chamber was 0.266 Pa. Then, sputtering was performed by applying RF (high frequency) at a power of 100 W and a frequency of 13.56 Hz to the target thereby generating argon plasmas to deposit an alloy film of a desired composition on one surface of the substrate. Then, the substrate was reversed and film was deposited by the same method.

In this case, alloy films shown in Table 1 were coated while changing the combination of the noble metal element and the non-noble metal element in the alloy film by changing the species of the metal elements used for the target or the chip, changing the content ratio between the noble metal element and the non-noble metal element in the alloy film by changing the number of sheets of the chips bonded to the targets, and controlling the film thickness by changing the film deposition time.

Then, the substrates deposited with the alloy films were heat treated in a vacuum atmosphere at 0.00665 Pa, at 500° C. for 5 min to obtain specimens.

For the obtained specimens, the content ratio between the noble metal element and the non-noble metal element in the alloy film (atomic ratio), the thickness of the alloy films, and the contact resistance before and after the heat treatment were measured. Further, as the index of the corrosion resistance in the corrosion environment, the contact resistance after immersion in sulfonic acid was measured.

Measurement for the Content Ratio Between Noble Metal Element and Non-Noble Metal Element The content ratio between the noble metal element and the non-noble metal element (atomic ratio) in the alloy film of the obtained specimen was measured by ICP (Inductively Coupled Plasma) emission spectrometry. In this case, the specimen was dissolved by using an acid solution capable of dissolving both the alloy film and the substrate, the concentration of the noble metal element and that of the non-noble metal element in the obtained solution were measured and the content ratio of the noble metal element and the non-noble metal element in the alloy film (atomic ratio) was calculated by normalizing the sum for them to 100%. In a case where the non-noble metal element was Ti, measurement was performed by depositing the alloy film on an Si wafer substrate.

Measurement of Contact Resistance Before and after Heat Treatment

For the specimen just after depositing an alloy film on the surface of a metal substrate (before heat treatment) and a specimen subjected to a heat treatment after forming the alloy film (after heat treatment), the contact resistance was measured with the equipment shown in FIG. 4. That is, a specimen 41 was set between two sheets of carbon cloths 42, 42 and, further, placed between two copper electrodes 43, 43 each having a contact area of 1 cm² at a current of 1 A supplied with a DC current power source 44, they were pressed at a load of 98 N (10 kgf), and a voltage applied between the carbon cloths 42, 42 was measured by a voltmeter 45, to determine the contact resistance.

Contact Resistance after Immersion in Aqueous Solution of Sulfuric Acid

After immersing the specimen 41 which was masked at a portion not coated with the alloy film such as an end surface in an aqueous solution of sulfuric acid (10 mmol/L) at 85° C. for 500 hours, it was taken out of the aqueous solution of sulfuric acid and, washed, dried, and the masking material was removed, then the contact resistance was measured in the same method as described above. It was judged as acceptable when the contact resistance after immersion in the aqueous solution of sulfuric acid was 15 mΩ·cm² or lower.

Table 1 shows the result of measurement for the content ratio between the noble metal element and the non-noble metal element in the alloy film (atomic ratio) and the thickness of the alloy film, the contact resistance before and after the heat treatment, and the contact resistance after immersion in the aqueous solution of sulfuric acid for each of the specimens.

TABLE 1

| | Alloy film | | | | Contact resistance (mΩ · cm²) | | |
|---|---|---|---|---|---|---|---|
| | Noble metal species | Non-noble metal species | Content ratio of noble metal element/non-noble metal element (atomic ratio) | Film thickness (nm) | Before heat treatment | After heat treatment | After immersion in aqueous solution of sulfuric acid |
| Example 1 | Au | Ta | 75/25 | 3 | 4.2 | 3.0 | 5.1 |
| Example 2 | Au | Ta | 65/35 | 10 | 5.2 | 3.1 | 6.4 |
| Example 3 | Au | Ta | 40/60 | 30 | 3.3 | 3.3 | 3.9 |
| Example 4 | Au | Nb | 55/45 | 10 | 6.0 | 4.2 | 6.9 |
| Example 5 | Au | Nb | 85/15 | 5 | 3.8 | 2.9 | 4.1 |
| Example 6 | Pt | Ta | 50/50 | 50 | 4.3 | 4.3 | 4.7 |
| Example 7 | Pt | Ta | 90/10 | 5 | 4.8 | 3.8 | 5.2 |
| Example 8 | Pt | Nb | 40/60 | 20 | 3.5 | 3.6 | 5.1 |
| Comp. Example 1 | Au | Ta | 30/70 | 10 | 4.3 | 7.2 | 220 |
| Comp. Example 2 | Au | Ta | 60/40 | 1 | 7.2 | 26.7 | 221.5 |
| Comp. Example 3 | Au | Ta | 98/2 | 5 | 4.0 | 2.8 | 19.8 |
| Comp. Example 4 | Pt | Nb | 75/25 | 1 | 10.2 | 77.5 | 253.0 |
| Comp. Example 5 | Pt | Nb | 98/2 | 10 | 4.1 | 2.9 | 51.5 |
| Comp. Example 6 | Ag | Nb | 70/30 | 10 | 6.5 | 5.0 | 99.3 |
| Comp. Example 7 | Ag | Ta | 55/45 | 10 | 10.0 | 9.6 | 125.6 |

In the specimens of Comparative Example 3 and Comparative Example 5, the content ratio of the noble metal is high. Accordingly, it was found that while the contact resistance after the heat treatment was low, the contact resistance after immersion in the aqueous solution of sulfuric acid increased and that the corrosion resistance in the corrosion environment was poor. This is considered to be attributable to that cohesion of the alloy film occurred during immersion in the aqueous solution of sulfuric acid to form a thick oxide film at the boundary between the substrate and the alloy film.

In the specimens of Comparative Examples 2 and 4, while the contact resistance was at a relatively low before the heat treatment, since the thickness of the alloy film is thin, oxidation by the heat treatment occurred excessively and the contact resistance increased. Further, in the specimens of Comparative Examples 2 and 4, the contact resistance increased after immersion in the aqueous solution of sulfuric acid. This is considered to be attributable to that the thickness of the alloy film was thin and, accordingly, the substrate was exposed at a number of portions such as at pinholes and a thick oxide film was formed at the boundary between the substrate and the alloy film.

In the specimens of Comparative Examples 6 and 7, it is considered that Ag was corroded or partially dissolved in an aqueous solution of sulfuric acid of 10 mmol/L at 85° C. and the contact resistance increased.

On the contrary, in the specimens of Examples 1 to 8, while the performance varied depending on the content ratio of the noble metal in the alloy film and the film thickness, good electroconductivity and corrosion resistance were shown.

Examples 9 to 16, Comparative Examples 8 to 12

After cleaning a substrate made of SUS304 (20×50×1 mm, Ra=12 nm) in acetone, an alloy film having the content ratio between the noble metal element and the film thickness shown in Table 2 were coated on the substrate by the same sputtering method as in Example 1. Then, the substrates deposited with the alloy film was heat treated in a vacuum atmosphere at 0.00665 Pa, at 500° C. for 5 min to obtain a specimen.

For the obtained specimen, the content ratio between the noble metal element and the non-noble metal element in the alloy film, and the contact resistant before and after the heat treatment and after immersion in an aqueous solution of sulfuric acid were measured in accordance with the same method as in Example 1.

Table 2 shows the result of measurement for each of the specimens on the content ratio between the noble metal element and the non-noble metal element in the alloy films, contact resistance before and after the heat treatment, and the contact resistance after immersion in the aqueous solution of sulfuric acid.

TABLE 2

| | Alloy film | | | | Contact resistance (mΩ · cm²) | | |
| --- | --- | --- | --- | --- | --- | --- | --- |
| | Noble metal species | Non-noble metal species | Content ratio of noble metal element/non-noble metal element (atomic ratio) | Film thickness (nm) | Before heat treatment | After heat treatment | After immersion in aqueous solution of sulfuric acid |
| Example 9 | Au | Ti | 45/55 | 10 | 6.9 | 5.0 | 8.7 |
| Example 10 | Au | Zr | 40/60 | 25 | 6.0 | 6.2 | 6.9 |
| Example 11 | Au | Zr | 72/28 | 5 | 6.9 | 5.5 | 8.2 |
| Example 12 | Au | Hf | 90/10 | 5 | 6.5 | 4.0 | 12.5 |
| Example 13 | Au | Hf | 46/54 | 40 | 4.2 | 4.0 | 9.0 |
| Example 14 | Pt | Ti | 70/30 | 20 | 5.0 | 3.9 | 6.3 |
| Example 15 | Pt | Zr | 55/45 | 10 | 6.9 | 4.5 | 6.5 |
| Example 16 | Pt | Nb | 85/15 | 5 | 5.2 | 4.2 | 7.5 |
| Comp. Example 8 | Au | Ta | 25/75 | 1 | 20.1 | 65.2 | 132.1 |
| Comp. Example 9 | Au | Ti | 40/60 | 1 | 7.6 | 45.6 | 105.6 |
| Comp. Example 10 | Au | Zr | 80/20 | 1 | 7.0 | 32.6 | 88.8 |
| Comp. Example 11 | Pt | Nb | 98/2 | 1 | 7.2 | 33.5 | 105.0 |
| Comp. Example 12 | Pt | Nb | 30/70 | 1 | 8.2 | 48.6 | 112.2 |

In the specimens of Comparative Examples 8, 9, 10, 11 and 12, while the contact resistance was relatively low before the heat treatment, the contact resistance increased after the heat treatment, since the thickness of the alloy film was thin. Further, in the specimens of Comparative Examples, 8, 9, 10, 11, and 12, the contact resistance increased after immersion in the aqueous solution of sulfuric acid. This is considered to be attributable to that the thickness of the alloy film was thin and, accordingly, the substrate was exposed at a number of portions such as at pinholes and a thick oxide film was formed at the boundary between the substrate and the alloy film. On the contrary, in the specimens of Examples 9 to 16, the thickness of the alloy film was 2 nm or more and, while the performance varied depending on the content ratio of the noble metal in the alloy film and the thickness of the alloy film, any of them showed good electroconductivity and corrosion resistance.

Examples 17 to 20, Comparative Example 13, Comparative Example 14

After supersonically cleaning a substrate made of pure titanium (20×50×0.15 mm, Ra=15 nm) according to JIS H 4600 class-1 in acetone, an alloy film having the content ratio of the noble metal element and the film thickness shown in Table 3 were coated on the substrate by the same sputtering method as in Example 1. Then, a heat treatment was performed under various heat treatment conditions shown in Table 3 to obtain specimens. In this case, the oxygen partial pressure was controlled after evacuating the inside of the heat treatment furnace to 0.00133 Pa, and heating to a predetermined temperature and then introducing oxygen while evacuating the inside of the furnace to the oxygen partial pressure shown in Table 3. The content ratio of the noble metal element in the alloy films and the contact resistance before and after the heat treatment and after immersion in the aqueous solution of sulfuric acid were measured for each of the specimens in accordance with the same method as in Example 1.

Table 3 shows the result of measurement for the content ratio between the noble metal element and the non-noble metal element, the film thickness, the contact resistance before and after heat treatment, and the contact resistance after immersion in the aqueous solution of sulfuric acid for each of the specimens.

TABLE 3

| | Alloy film | | | | Heat treatment condition | | | Contact resistance (mΩ·cm²) | | |
|---|---|---|---|---|---|---|---|---|---|---|
| | Noble metal species | Non-noble metal species | Content ratio of noble metal element/non-noble metal element (atomic ratio) | Film thickness (nm) | Oxygen partial pressure (Pa) | Heat treatment temperature (° C.) | Heat treatment hour (min) | Before heat treatment | After heat treatment | After immersion in aqueous solution of sulfuric acid |
| Example 17 | Au | Ta | 50/50 | 10 | 0.133 | 500 | 30 | 5.0 | 5.4 | 7.6 |
| Example 18 | Au | Nb | 80/20 | 10 | 1.33 | 400 | 45 | 3.8 | 3.2 | 6.6 |
| Example 19 | Pt | Ta | 40/60 | 5 | 0.0133 | 300 | 30 | 7.6 | 6.5 | 10.5 |
| Example 20 | Pt | Zr | 75/25 | 10 | 13.3 | 600 | 5 | 6.0 | 4.5 | 5.8 |
| Comp. Example 13 | Au | Ta | 98/2 | 5 | 0.133 | 820 | 10 | 4.5 | 22.7 | 25.5 |
| Comp. Example 14 | Pt | Nb | 33/67 | 10 | 1.33 | 850 | 10 | 6.1 | 32.5 | 38.2 |

In the specimen of Comparative Example 13, the contact resistance increased after the heat treatment. This is considered to be attributable to that the alloy film subjected to cohesion since the heat treatment temperature was excessively high to form a thick oxide film on the surface of the substrate.

In the specimen of Comparative Example 14, increase of the contact resistance was observed after the heat treatment. This is considered to be attributable to that while the alloy film was not cohesed, a thick oxide film was formed on the surface of the alloy film since the heat treatment temperature was excessively high, and the contact resistance after the heat treatment increased remarkably. On the contrary, in the specimens of Examples 17 to 20, since heat treatment was performed at a temperature of lower than 800° C., while the performance varied in accordance with the content ratio of the noble metal in the alloy films and the thickness of the alloy films, any of them showed good electroconductivity and corrosion resistance.

Examples 21 to 36, Comparative Examples 15 to 18

After supersonically cleaning a substrate made of pure titanium (20×50×0.15 mm, Ra=15 nm) according to JIS H 4600 class-1 in acetone, an alloy films was deposited by the same sputtering method as in Example 1. Au was used for the noble metal element and Ta was used for then on-noble metal element in the alloy film in each case. Further, the film thickness was adjusted to 20 nm by controlling the deposition time. Then, a heat treatment was performed under various heat treatment conditions shown in Table 4 (heat treatment atmosphere (Pa), heat treatment temperature (° C.)) for 5 min, to obtain specimens.

The content ratio of the noble metal element (Au/Ta) (atomic ratio) and the contact resistance (mΩ·cm²) before and after the heat treatment and after immersion in the aqueous solution of sulfuric acid of the specimens were measured in accordance with the same method as in Example 1.

Table 4 shows the result of measurement for the content ratio of the noble metal element/non-noble metal element of the alloy film, the contact resistance before and after the heat treatment, and the contact resistance after immersion in the aqueous solution of sulfuric acid for each of the specimens, with the heat treatment conditions.

TABLE 4

| | Content ratio of noble metal element/non-noble metal element (Au/Ta) (atomic ratio) | Heat treatment condition | | Contact resistance (mΩ·cm²) | | |
|---|---|---|---|---|---|---|
| | | Heat treatment atmosphere (Pa) | Heat treatment temperature (° C.) | Before heat treatment | After heat treatment | After immersion in aqueous sulfuric acid solution |
| Example 21 | 80/20 | No heat treatment | No heat treatment | 3.9 | 3.9 | 9.3 |
| Example 22 | 37/63 | No heat treatment | No heat treatment | 3.5 | 3.5 | 5.1 |
| Example 23 | 80/20 | Atmospheric pressure | 200 | 3.9 | 3.8 | 3.9 |
| Example 24 | 37/63 | Atmospheric pressure | 200 | 3.5 | 3.2 | 4.1 |
| Example 25 | 80/20 | Atmospheric pressure | 400 | 3.9 | 3.3 | 4.5 |
| Example 26 | 37/63 | Atmospheric pressure | 400 | 3.5 | 5.1 | 6.3 |
| Example 27 | 80/20 | Atmospheric pressure | 500 | 3.9 | 4.7 | 7.2 |
| Example 28 | 80/20 | 0.00665 | 300 | 3.9 | 2.5 | 4.5 |
| Example 29 | 37/63 | 0.00665 | 300 | 3.5 | 2.4 | 3.9 |
| Example 30 | 95/5 | 0.00665 | 400 | 3.2 | 2.6 | 5.2 |

TABLE 4-continued

| | Content ratio of noble metal element/non-noble metal element (Au/Ta) (atomic ratio) | Heat treatment condition | | Contact resistance (mΩ · cm²) | | |
|---|---|---|---|---|---|---|
| | | Heat treatment atmosphere (Pa) | Heat treatment temperature (° C.) | Before heat treatment | After heat treatment | After immersion in aqueous sulfuric acid solution |
| Example 31 | 80/20 | 0.00665 | 400 | 3.9 | 3.6 | 4.6 |
| Example 32 | 37/63 | 0.00665 | 400 | 3.5 | 3.2 | 4.0 |
| Example 33 | 80/20 | 0.00665 | 500 | 3.9 | 3.6 | 4.8 |
| Example 34 | 37/63 | 0.00665 | 500 | 3.5 | 3.6 | 5.0 |
| Example 35 | 80/20 | 0.00665 | 600 | 3.9 | 5.0 | 5.6 |
| Example 36 | 37/63 | 0.00665 | 600 | 3.5 | 3.9 | 5.1 |
| Comp. Example 15 | 30/70 | No heat treatment | No heat treatment | 4.3 | 4.3 | 52.4 |
| Comp. Example 16 | 30/70 | Atmospheric pressure | 200 | 4.3 | 4.0 | 18.3 |
| Comp. Example 17 | 30/70 | Atmospheric pressure | 400 | 4.3 | 15.0 | 66.3 |
| Comp. Example 18 | 30/70 | 0.00665 | 400 | 4.3 | 5.8 | 165.0 |

In the specimen of Comparative Example 15, the contact resistance after the film deposition was not changed substantially from the specimen which content ratio of the non-noble metal element is lower. This is considered to be attributed to that the content ratio of the non-noble metal element was high. The contact resistance increased after immersion in the aqueous solution of sulfuric acid.

The specimen of Comparative Example 16 has the same high content ratio of the non-noble metal element as Comparative Example 15 and was heat treated under an atmospheric air condition at a relatively low temperature. In the specimen of Comparative Example 16, while the contact resistance after immersion in the aqueous solution of sulfuric acid was lower than that of the specimen of Comparative Example 15, it exceeded 15 mΩ·cm².

The specimen of Comparative Example 17 has the same high content ratio of the non-noble metal element as Comparative Example 15 of and was heat treated under the atmospheric air condition at a relatively high temperature. In the specimen of Comparative Example 17, contact resistance increased after the heat treatment. Further, the contact resistance also increased after immersion in the aqueous solution of sulfuric acid.

The specimen of Comparative Example 18 was that of Comparative Example 15 which was heat treated in vacuum (0.00665 Pa). In the specimen of Comparative Example 18, while the contact resistance after the heat treatment was not over 15 mΩ·cm², the contact resistance increased remarkably after immersion in the aqueous solution of sulfuric acid.

On the contrary, in the specimens of Examples 21 to 36, while the performance varied depending on the content ratio of the noble metal in the alloy films and heat treatment conditions, they show good electroconductivity and corrosion resistance.

Example 37, Example 38, Comparative Example 19

After supersonically cleaning a mirror-polished substrate made of pure titanium (20×50×0.15 mm, Ra=3 nm) according to JIS H 4600, class-1, in acetone, an alloy film was deposited on the substrate by the same sputtering method as in Example 1. Au was used as the noble metal element and Ta was used as the non-noble metal element for the sputtering target. Further, the film thickness was adjusted to 20 nm by controlling the film deposition time. Then, a heat treatment was performed under various heat treatment conditions shown in Table 5 (heat treatment atmosphere (Pa), heat treatment temperature (° C.)) to obtain specimens. The heat treatment was conducted for 5 min at each temperature.

The content ratio of noble metal element/non-noble metal element (Au/Ta) (atomic ratio) of the alloy films and the contact resistance (mΩ·cm²) before and after the heat treatment and after immersion in the aqueous solution of sulfuric acid were measured for each specimen in accordance with the same method as in Example 1. For the contact resistance after immersion in the aqueous solution of sulfuric acid, the contact resistance was measured by immersing each specimen in an aqueous solution of sulfuric acid (1 mol/L) at 80° C. for 100 hours.

Table 5 shows the result of measurement for the content ratio of the noble metal element/non-noble metal element in the alloy film, the contact resistance after the heat treatment and the contact resistance after immersion in the aqueous solution of sulfuric acid for each specimen.

TABLE 5

| | Content ratio of noble metal element/non-noble metal element (Au/Ta) (atomic ratio) | Heat treatment condition | | Contact resistance (mΩ · cm²) | | |
|---|---|---|---|---|---|---|
| | | Heat treatment atmosphere (Pa) | Heat treatment temperature (° C.) | Before heat treatment | After heat treatment | After immersion in aqueous sulfuric acid solution |
| Comp. Example 19 | 100/0 | No heat treatment | No heat treatment | 1.3 | 1.3 | Measurement impossible |

TABLE 5-continued

| | Content ratio of noble metal element/non-noble metal element (Au/Ta) (atomic ratio) | Heat treatment condition | | Contact resistance (mΩ · cm$^2$) | | |
|---|---|---|---|---|---|---|
| | | Heat treatment atmosphere (Pa) | Heat treatment temperature (° C.) | Before heat treatment | After heat treatment | After immersion in aqueous sulfuric acid solution |
| Example 37 | 37/63 | No heat treatment | No heat treatment | 1.1 | 1.1 | 9.5 |
| Example 38 | 37/63 | 0.00665 | 400 | 1.1 | 0.9 | 9.0 |

In the specimen of Comparative Example 19, since the titanium substrate was dissolved to the aqueous solution of sulfuric acid after the immersion test, the contact resistance could not be measured. This is considered to be attributable to that the pure Au film was cohesed and peeled to expose and dissolve the titanium substrate.

On the contrary, in the specimens of Example 37 and Example 38, good result was obtained by the following reasons: the formation of pinholes in the alloy film was prevented by smoothing the surface of the substrate; and by alloying of Au with Ta at an appropriate content ratio in the alloy film, adhesion with the metal substrate was not deteriorated even during immersion in the aqueous solution of sulfuric acid, the alloy film was not cohesed, and the alloy film had excellent corrosion resistance.

Example 39

The metal separator of the invention was assembled into a fuel cell and a power generation test was performed.

The metal separator was manufactured by the following procedures.

At first, as shown in FIG. 2 (A), a gas flow channel 21 of 0.6 mm groove width and 0.5 mm groove depth was fabricated by machining in the central portion on the surface of a metal substrate 2 comprising a titanium plate (95.2×95.2×19 mm). The gas flow channel 21 has gas introduction ports 22 on both ends thereof for introducing a hydrogen gas or air.

Upon deposition of an alloy film, an Au—Ta alloy target was manufactured and film deposition was performed with this target. Powders of Au and Ta were mixed such that the Au composition was 60 at % and molding was performed in the order of die charging, mold-degassing, HIP, demolding, forging, rolling, and machining to manufacture a disk-shaped sputtering target of 152.4 mm (6 inch) outer diameter and 5 mm thickness.

Then, an alloy film comprising Au and Ta was coated to a film thickness of 20 nm on the surface of the metal substrate 2 formed with the gas flow channel 21 by using the Au and Ta sputtering target under the same film deposition conditions as in Example 1. As a result of measuring the Au composition in the alloy film formed by deposition on a pure titanium substrate by using the same sputtering target under the same conditions by ICP emission spectrometry, it was confirmed that the composition was 61 at % which was substantially identical with that in the target composition.

Then, the metal substrate 2 deposited with the alloy film comprising Au and Ta was heat treated in a vacuum atmosphere under 0.00665 Pa, at 500° C., for 5 min to manufacture a metal separator.

Then, as shown in FIG. 3, the metal separators 31, 31 were assembled into a unit cell 1 of a commercial fuel cell (EFC-05-01SP) 20 manufactured by Electrochem Co. In the fuel cell shown in FIG. 3, 32 denotes a solid polymer film and 33 denotes a carbon cloth.

Then, a power generation test was performed. A hydrogen gas at 99.999% was used as a fuel gas on the side of the anode electrode and air was used as a gas on the side of the cathode electrode. In this case, the fuel cell was entirely heated to 80° C. and maintained at that temperature, and the hydrogen gas and air were past through the heated water to adjust the dew point to 80° C., and they were introduced at a temperature of 2026 hPa (2 atm) into the fuel cell.

A power generation test was conducted at a current flowing to the separator of 300 mA/cm$^2$ for 100 hours, with a cell performance measuring system (890CL manufactured by Scribner Associates Incorporated). And then the change of the voltage and power were measured.

As a result, at the separator of the titanium substrate the voltage both at the initial stage of generation and after power generation for 100 hours were at 0.61 V, which showed no voltage change.

Further, as an object of comparison, a graphite separator (FC05-MP manufactured by Electrochem Co.) used so far was disposed in place of the separator of the titanium substrate to manufacture a fuel cell and a power generation test was performed under the same conditions as described above.

As a result, both the voltage at the initial stage of power generation and the voltage after power generation for 100 hours were at 0.61 V, which provided the same result as that in the separator of the titanium substrate described above.

From the results described above, it has been found that the separator manufactured by the manufacturing method for the fuel cell separator according to the invention, although it was a metal separator, shows the same performance equivalent as that of the graphite separator.

While the invention has been described specifically with reference to specific embodiments, it will be apparent for a person skilled in the art that various changes and modifications are possible without departing from the gist and the scope of the invention.

The present application is based on the Japanese patent application filed on Dec. 21, 2006 (Japanese Patent Application No. 2006-344895) and Japanese patent application filed on Sep. 21, 2007 (Japanese Patent Application No. 2007-245917), which are entirely cited by reference.

Further, all of the references cited herein are incorporated entirely.

INDUSTRIAL APPLICABILITY

According to the invention, it is possible to provide an alloy film for a metal separator for a fuel cell which is excellent in corrosion resistance, has low contact resistance, capable of maintaining the low contact resistance for a long time even in a corrosive environment and, further, excellent in the productivity, a manufacturing method thereof, and a target material for sputtering, as well as a metal separator and a fuel cell.

The invention claimed is:

1. A metal separator, comprising:
a metal substrate, and
an alloy film, coating a surface of the metal substrate,
wherein the alloy film consists of Au as a noble metal element and at least one non-noble metal element selected from the group consisting of Zr, Nb, Hf, and Ta,
wherein a content ratio of the noble metal element/non-noble metal element is from 35/65 to 95/5 by atomic ratio, and
wherein a film thickness is 2 nm or more.

2. The metal separator of claim 1, wherein the non-noble metal element consists of Ta and optionally at least one additional element selected from the group consisting of Zr, Nb, and Hf.

3. The metal separator of claim 1, wherein the non-noble metal element consists of Zr and optionally at least one additional element selected from the group consisting of Nb, Hf, and Ta.

4. The metal separator of claim 1, wherein the non-noble metal element consists of Nb and optionally at least one additional element selected from the group consisting of Zr, Hf, and Ta.

5. The metal separator of claim 1, wherein the non-noble metal element consists of Hf and optionally at least one additional element selected from the group consisting of Zr, Nb, and Ta.

6. The metal separator of claim 1, wherein the content ratio of the noble metal element/non-noble metal element is from 35/65 to 80/20.

7. The metal separator of claim 1, wherein the film thickness is from 5 nm to 500 nm.

8. A fuel cell, comprising the metal separator of claim 1.

9. The metal separator of claim 1, wherein at least a portion on the surface of the metal substrate comprises a concave portion suitable for providing a gas flow channel that allows a gas to pass therethrough.

10. The metal separator of claim 1, wherein the metal substrate comprises at least one metal selected from the group consisting of titanium, a titanium comprising alloy, aluminum, an aluminum comprising alloy, and stainless steel.

11. A method of manufacturing the metal separator of claim 1, comprising:
coating, by a sputtering method, at least a portion of a surface of the metal substrate, with an alloy film consisting of the noble metal element and the at least one non-noble metal element at the content ratio of from 35/65 to 95/5 by atomic ratio,
wherein the metal substrate is in a chamber of an apparatus suitable for sputtering during the coating, and
wherein the film thickness of 2 nm or more is attained.

12. The method of claim 11, wherein the coating is performed while heating the metal substrate at 150 to 800° C.

13. The method of claim 11, further comprising:
heat treating the metal substrate coated with the alloy film on its surface after the coating.

14. The method of claim 13, wherein the temperature of the heat treating is from 150 to 800° C.

15. The method of claim 14, wherein the heat treating is performed in an atmosphere having an oxygen partial pressure of $2.1 \times 10^4$ Pa or lower.

16. A method of manufacturing a fuel cell, comprising:
manufacturing a metal separator by the method of claim 11, and
manufacturing a fuel cell with the metal separator.

17. The method of claim 16, wherein manufacturing the metal separator further comprises:
forming a concave portion which provides a gas flow channel, configured to allow a gas to pass therethrough, in at least a portion on the surface of the metal substrate, before the coating.

18. The method of claim 16, wherein during the coating during manufacturing the metal separator, the metal substrate is heated at from 150 to 800° C.

19. The method of claim 16, wherein manufacturing the metal separator further comprises:
heat treating the metal substrate coated with the alloy film after the coating.

20. The method of claim 19, wherein the temperature of the heat treating is from 150 to 800° C.

21. The method of claim 20, wherein the heat treating is performed under an atmosphere having an oxygen partial pressure of $2.1 \times 10^4$ Pa or lower.

* * * * *